(12) United States Patent
Lee et al.

(10) Patent No.: US 10,804,211 B2
(45) Date of Patent: Oct. 13, 2020

(54) SEMICONDUCTOR STRUCTURE AND FABRICATING METHOD THEREOF

(71) Applicant: TAIWAN SEMICONDUCTOR MANUFACTURING CO. LTD., Hsin-Chu (TW)

(72) Inventors: Kuo-Hung Lee, Taipei (TW); Chih-Fei Lee, Tainan (TW); Fu-Cheng Chang, Tainan (TW); Ching-Hung Kao, Tainan (TW)

(73) Assignee: TAIWAN SEMICONDUCTOR MANUFACTURING COMPANY LIMITED, hsin-chu (TW)

( * ) Notice: Subject to any disclaimer, the term of this patent is extended or adjusted under 35 U.S.C. 154(b) by 0 days.

(21) Appl. No.: 16/022,896

(22) Filed: Jun. 29, 2018

(65) Prior Publication Data
US 2018/0323152 A1    Nov. 8, 2018

Related U.S. Application Data

(62) Division of application No. 15/158,402, filed on May 18, 2016, now Pat. No. 10,020,265.
(Continued)

(51) Int. Cl.
| | |
|---|---|
| *H01L 23/544* | (2006.01) |
| *H01L 21/78* | (2006.01) |
| *H01L 23/522* | (2006.01) |
| *H01L 23/528* | (2006.01) |
| *H01L 49/02* | (2006.01) |

(52) U.S. Cl.
CPC ............ *H01L 23/544* (2013.01); *H01L 21/78* (2013.01); *H01L 23/528* (2013.01); *H01L 23/5223* (2013.01); *H01L 28/40* (2013.01); *H01L 28/60* (2013.01); *H01L 28/91* (2013.01); *H01L 2223/5442* (2013.01);
(Continued)

(58) Field of Classification Search
CPC . H01L 23/544; H01L 23/5223; H01L 23/528; H01L 21/78; H01L 28/40; H01L 28/60; H01L 28/91
See application file for complete search history.

(56) References Cited

U.S. PATENT DOCUMENTS

| | | |
|---|---|---|
| 6,239,461 B1 | 5/2001 | Lee |
| 2001/0025976 A1 | 10/2001 | Lee |

(Continued)

FOREIGN PATENT DOCUMENTS

| | | |
|---|---|---|
| CN | 1269600 A | 10/2000 |
| CN | 1458667 A | 11/2003 |

(Continued)

OTHER PUBLICATIONS

Corresponding Chinese Patent Application No. 201610961740.0, Chinese Office Action dated Sep. 5, 2018.

*Primary Examiner* — Patricia D Reddington
(74) *Attorney, Agent, or Firm* — Cooper Legal Group, LLC

(57) ABSTRACT

A method of fabricating a semiconductor structure includes forming an alignment mark layer on a substrate; patterning the alignment mark layer for forming at least one alignment mark feature; forming a bottom conductive layer on the patterned alignment mark layer in a substantially conformal manner; forming an insulator layer on the bottom conductive layer; and forming a top conductive layer on the insulator layer.

20 Claims, 13 Drawing Sheets

Related U.S. Application Data

(60) Provisional application No. 62/269,043, filed on Dec. 17, 2015.

(52) U.S. Cl.
CPC ............... *H01L 2223/5446* (2013.01); *H01L 2223/54426* (2013.01); *H01L 2223/54453* (2013.01)

(56) References Cited

U.S. PATENT DOCUMENTS

| | | | |
|---|---|---|---|
| 2005/0274978 A1 | 12/2005 | Antoniadis et al. | |
| 2005/0274987 A1* | 12/2005 | Coolbaugh | H01L 23/5223 257/222 |
| 2006/0189071 A1 | 8/2006 | Grant | |
| 2014/0098459 A1* | 4/2014 | Lee | H01L 27/10805 361/306.1 |
| 2015/0333117 A1* | 11/2015 | Sako | H01L 27/10852 257/309 |

FOREIGN PATENT DOCUMENTS

| | | |
|---|---|---|
| CN | 101593744 A | 12/2009 |
| CN | 102063015 A | 5/2011 |
| CN | 102420214 A | 4/2012 |
| CN | 104299960 A | 1/2015 |

\* cited by examiner

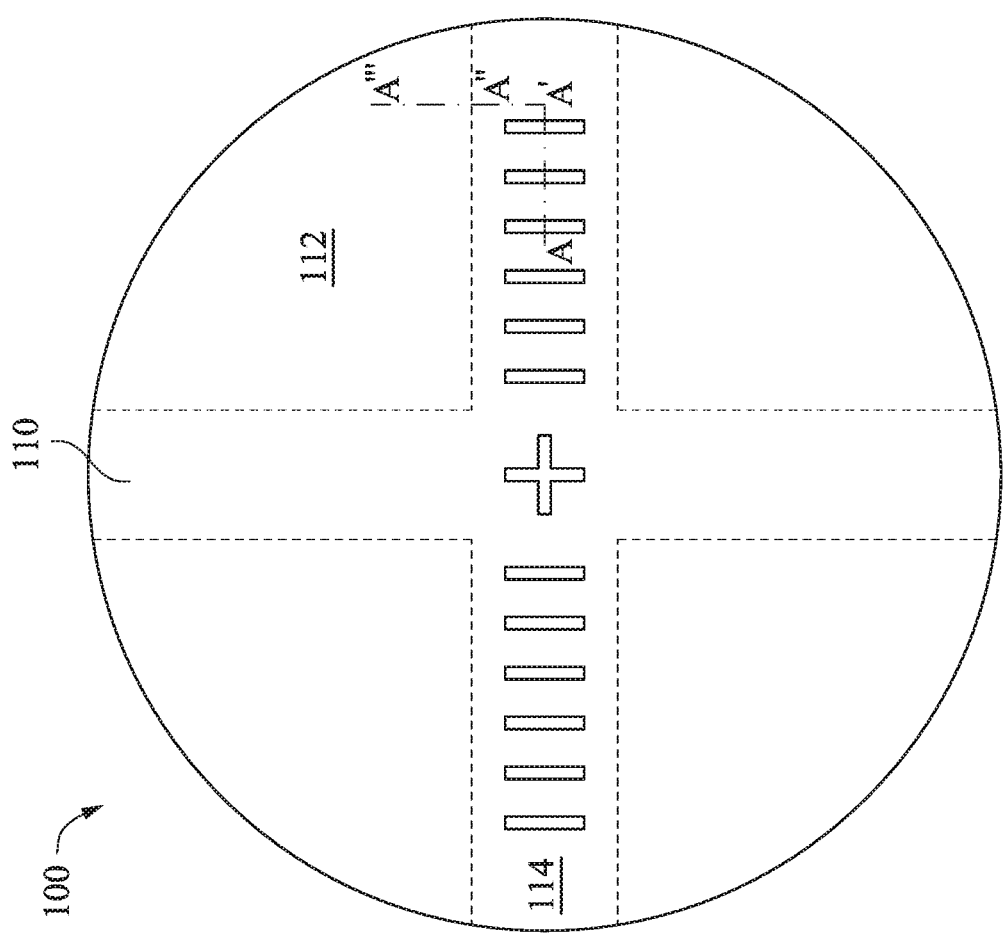

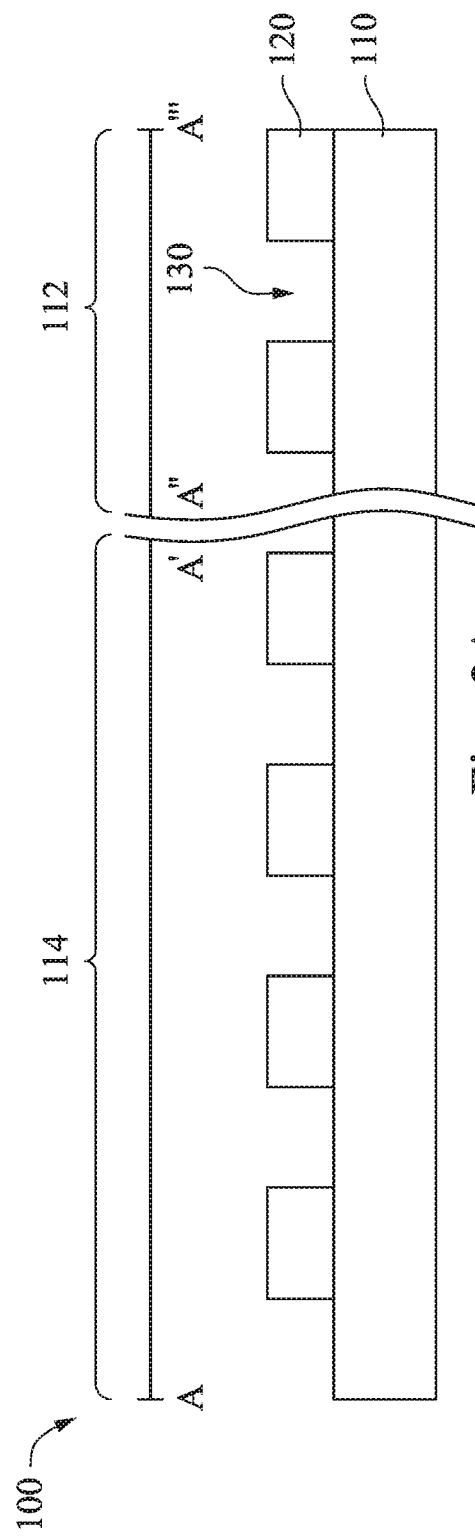
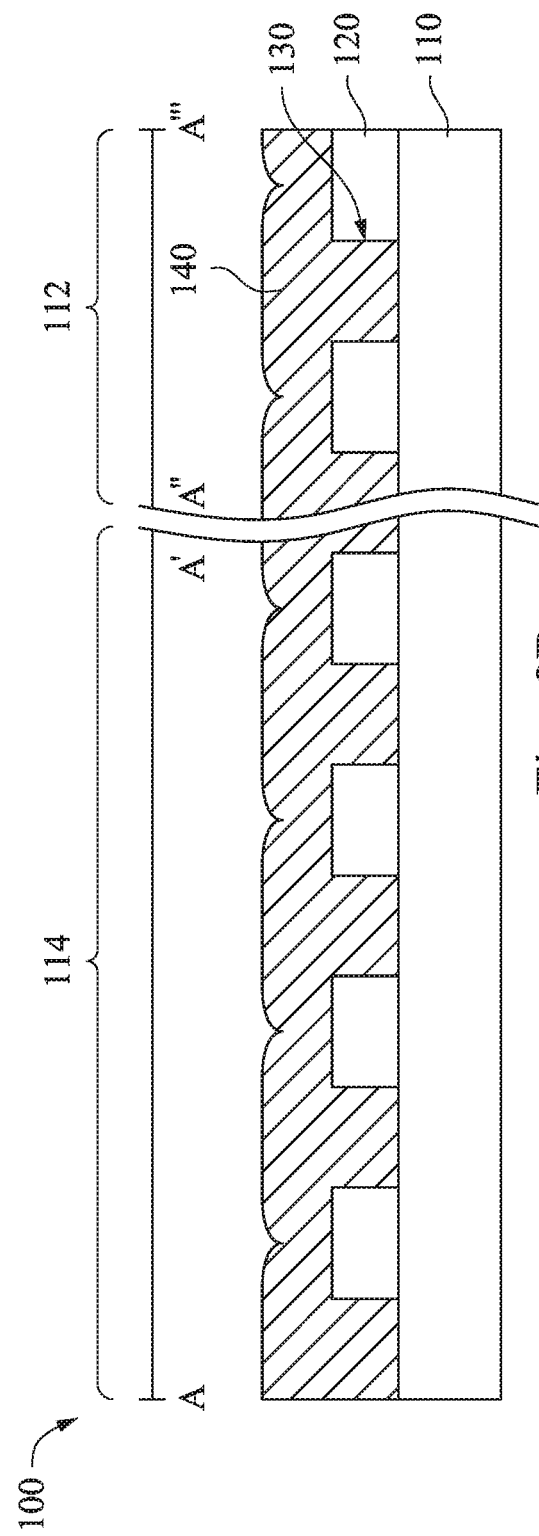

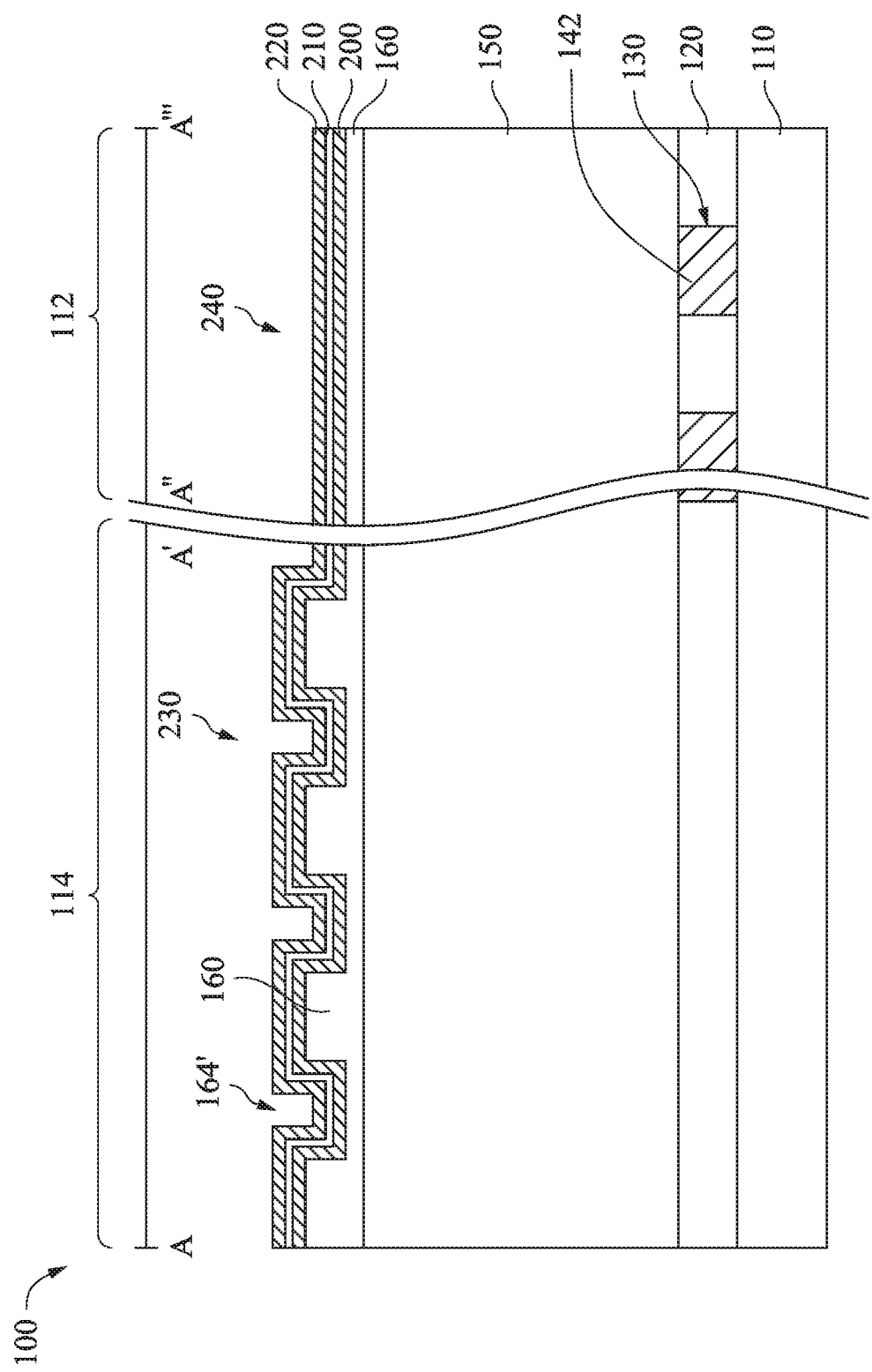

SEMICONDUCTOR STRUCTURE AND FABRICATING METHOD THEREOF

RELATED APPLICATIONS

This application is a divisional of and claims priority to U.S. Non-Provisional Application Ser. No. 15/158,402, titled "SEMICONDUCTOR STRUCTURE AND FABRICATING METHOD THEREOF" and filed on May 18, 2016, which claims priority to U.S. Provisional Application Ser. No 62/269,043, titled "ALIGNMENT STRATEGY FOR METAL INSULATOR METAL (MIM) PRODUCTIONS" and filed on Dec. 17, 2015. U.S. Non-Provisional Application Ser. No. 15/158,402 and U.S. Provisional Application Ser. No. 62/269,043 are herein incorporated by reference.

BACKGROUND

The fabrication of microcircuit devices on a semiconductor wafer involves a number of steps where patterns are transferred from photolithographic masks on the wafer. The masking step includes an etching step and defines selected areas to be exposed on the wafer for subsequent processes such as oxidation, metal deposition and impurity introduction.

In the production of integrate circuit structures, structures have a plurality of layers due the ever increasing density of the circuit elements in the structure. Further, as the device and feature sizes becoming smaller, there is a need to align the photolithographic mask precisely with the wafer during the masking step to minimize the misalignment between the layers

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic local top view of a semiconductor structure, in accordance with some embodiments of the disclosure.

FIG. 2A to FIG. 2L respectively are schematic cross-sectional views of different stages of fabricating a semiconductor structure, in accordance with some embodiments of the disclosure.

FIG. 3 is a schematic cross-sectional view of a semiconductor structure, in accordance with some embodiments of the disclosure.

DETAILED DESCRIPTION

Figure 2C:
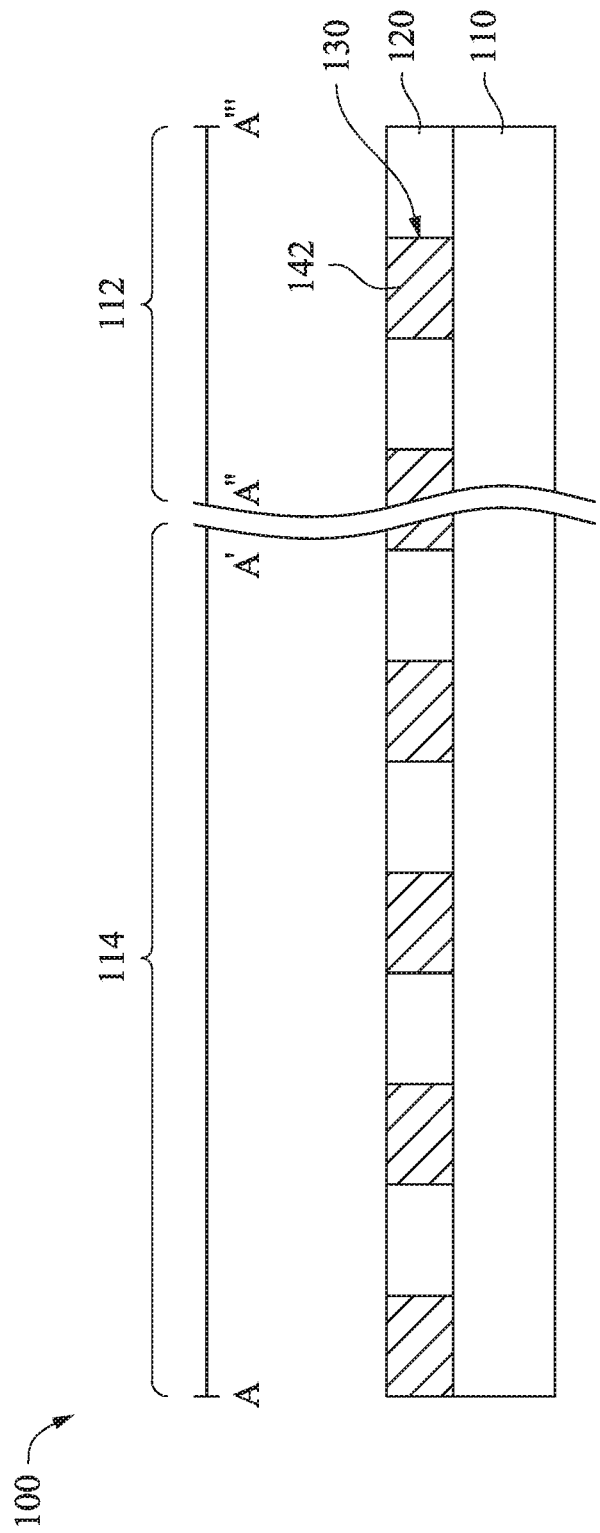

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the fabrication of the integrated circuit structures, a number of metallization layers are formed. Each of the metallization layers is typically separated from another metallization layer by an insulating layer. To provide an overlying metallization layer without discontinuities or other flaws, it is desirous to provide an underlying surface for the metallization layer that is as flat or planar as possible. It has therefore, become the practice to smooth the surface of a layer in preparation for a subsequently applied metallization layer by a process of planarization, such as a chemical-mechanical polishing (CMP) planarization.

CMP planarization of the wafer involves holding the wafer against a rotating polishing pad wet with slurry and at the same time applying pressure. The CMP planarization technique provides a global planarization, that is, one that provide a large planarization range the generally covers the whole wafer surface. Since the planarization range is large, the steps of the alignment marks on a previously formed overlying layer on the wafer may be flattened after it is planarized by the CMP technique. The steps of the alignment marks on the previous layer are not replicated to the overlying layer. The overlying layer may cause alignment mark reading problems by interfering with the diffraction pattern, such as where the overlying layer is a thick oxide or a nitride layer.

Therefore, the present disclosure provides a semiconductor structure having a clear alignment mark on the metallization layer, in which the alignment mark is formed after the planarization process for the metallization layer, such that the alignment mark remains readable for the following overlying layer, and the problem caused by such as mask misalignment can be prevented.

Reference is made to FIG. 1, in which FIG. 1 is a schematic local top view of a semiconductor structure, in accordance with some embodiments of the disclosure. A semiconductor structure 100 including a semiconductor substrate 110 is provided. The semiconductor structure is understood to possibly include a semiconductor wafer, active and passive devices formed within the wafer, and insulating and conductive layers formed over the wafer surface.

The semiconductor substrate 110 includes a plurality of product regions 112 and at least one alignment region 114. The product region 112 is the region where integrated circuits are formed. For example, the product region 112 includes at least one integrated circuit therein, in which the integrated circuit may include a plurality of semiconductor components, such as resistors, inductors, and capacitors. A capacitor, for example, includes two conductive electrodes on opposing sides of a dielectric or other insulator layer, and may be categorized based on the materials employed to form the electrodes. For example, in a metal-insulator-metal (MIM) capacitor, the electrodes substantially comprise metallic materials. MIM capacitors provide relatively constant value of capacitance over a relatively wide range of voltages applied thereto. MIM capacitors also exhibit a relatively small parasitic resistance.

The alignment region 114 is where alignment marks (e.g., alignment mark trenches) are formed. The alignment region 114 may have any shape, such as in a shape of rectangular.

The alignment region 114 is arranged neighbor to the product regions 112. In some embodiments, the product regions 112 are arranged in an array, and the alignment region 114 is arranged between at least two of the product regions 112. Namely, some of the product regions 112 are spaced by the alignment region 114. In some embodiments, the alignment region 114 can be disposed at a cutting path of the semiconductor structure 100, in which a cutting tool cuts through the alignment region 114 when the semiconductor substrate 110 is cut to separate the product regions 112. In some embodiments, the alignment marks (e.g., alignment mark trenches) on the alignment region 114 are cut and destroyed after the semiconductor substrate 110 is cut. In some other embodiments, the alignment marks (e.g., alignment mark trenches) on the alignment region 114 remain complete after the semiconductor substrate 110 is cut.

Reference is made to FIG. 2A to FIG. 2J, in which FIG. 2A to FIG. 2J respectively are schematic cross-sectional views of different stages of fabricating a semiconductor structure, in accordance with some embodiments of the disclosure. FIG. 2A to FIG. 2J are taken along line A-A'-A"-A'" of FIG. 1, in which the section between A-A' is corresponding to the alignment region 114, and the section between A"-A'" is corresponding to the product region 112.

Referring to FIG. 2A, a semiconductor substrate 110 is provided. The semiconductor substrate 110 may be a semiconductor material and may include known structures including a graded layer or a buried oxide, for example. In some embodiments, the substrate includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate. Alternatively, the substrate may be an active layer of a semiconductor-on-insulator (SOI) substrate or a multi-layered structure such as a silicon-germanium layer formed on a bulk silicon layer.

In some embodiments, the semiconductor substrate 110 includes a dielectric layer 120. The dielectric layer 120 can be an inter-metal dielectric (IMD) having a low dielectric constant value (k value), for example, lower than about 3.5. The dielectric layer 110 may comprise dielectric materials, such as silicon oxide, silicon nitride, silicon oxy-nitride, or other suitable material.

The dielectric layer 120 has a top surface, and the openings 130 are formed at the top surface of the dielectric layer 120. The opening 130 may be formed, for example, by forming a patterned photoresist layer (not shown) over the dielectric layer 120 and using a dry etch processing step to remove portions of the dielectric layer 120 to define the opening 130 by using the patterned photoresist layer (not shown) as a mask. Various suitable dry etch processes may be used. After the dry etch processing step, the patterned photoresist layer (not shown) is removed by, for example, a photolithographic removal process. The openings 130 are damascene openings, such as via openings for metal plugs, or trench openings for metal lines. In some embodiments, the openings 130 are disposed at both product region 112 and the alignment region 114. In some other embodiments, the openings 130 are disposed at the product region 112.

Referring to FIG. 2B, a metal layer 140 is formed on the dielectric layer 120 and fills the openings 130. The material of metal layer 140 may include copper or copper alloys, or other suitable conductive materials, such as silver, gold, tungsten, aluminum, and the like. The metal layer 140 can be formed by a deposition process. The thickness of the metal layer 140 is thinner than the dielectric layer 130 but is thick enough to fill the openings 130.

Referring to FIG. 2C, a planarization process is performed to remove the excess portion of the metal layer 140. The planarization process can be any suitable planarization process, such as a chemical mechanical polishing (CMP) process. The portion of the metal layer 140 that has accumulated over the surface of the dielectric layer 120 is removed, such that the conductive features 142 are present in the opening 130 are extended from the top surface into the dielectric layer 120. The chemical mechanical polishing process is performed to level the surface of conductive features 142 and the dielectric layer 120.

In some embodiments, a barrier layer is optionally deposited over inside surfaces of opening 130 and over the surface of the dielectric layer 120 before the metal layer 140 is formed. The barrier layer may prevent the metal such as copper from diffusing into the dielectric layer 120. The barrier layer can be deposited using methods of such as chemical vapor deposition (CVD) or physical vapor deposition (PVD), to a thickness of between about 50 and 300 angstrom. The material of the barrier layer includes Ta, TaN or TiN.

In some other embodiments, an etch stop layer is optionally disposed on the surface of the conductive features 142 and the dielectric layer 120. The formed by a series of deposition processes. The etch stop layer can be formed by any suitable deposition process, such as a CVD, PVD, atomic layer deposition (ALD), remote plasma enhanced chemical vapor deposition (RPECVD), liquid source misted chemical deposition (LSMCD), coating, spin-coating or another process that is adapted to form a thin film layer over the substrate. The etch stop layer may include a material selected from nitrogen doped (silicon) carbide (SiC:N, also known as NDC), oxygen doped (silicon) carbide (SiC:O, also known as ODC), and combinations thereof. One skilled in the art will realize, however, that the materials recited throughout the description are merely examples, and will change if different formation technologies are used.

The processes discussed in FIG. 2B and FIG. 2C can be performed more than once to construct a plurality of metallization layers. The metallization layers can be utilized as interconnection or a mark for mask alignment.

Figure 2D:
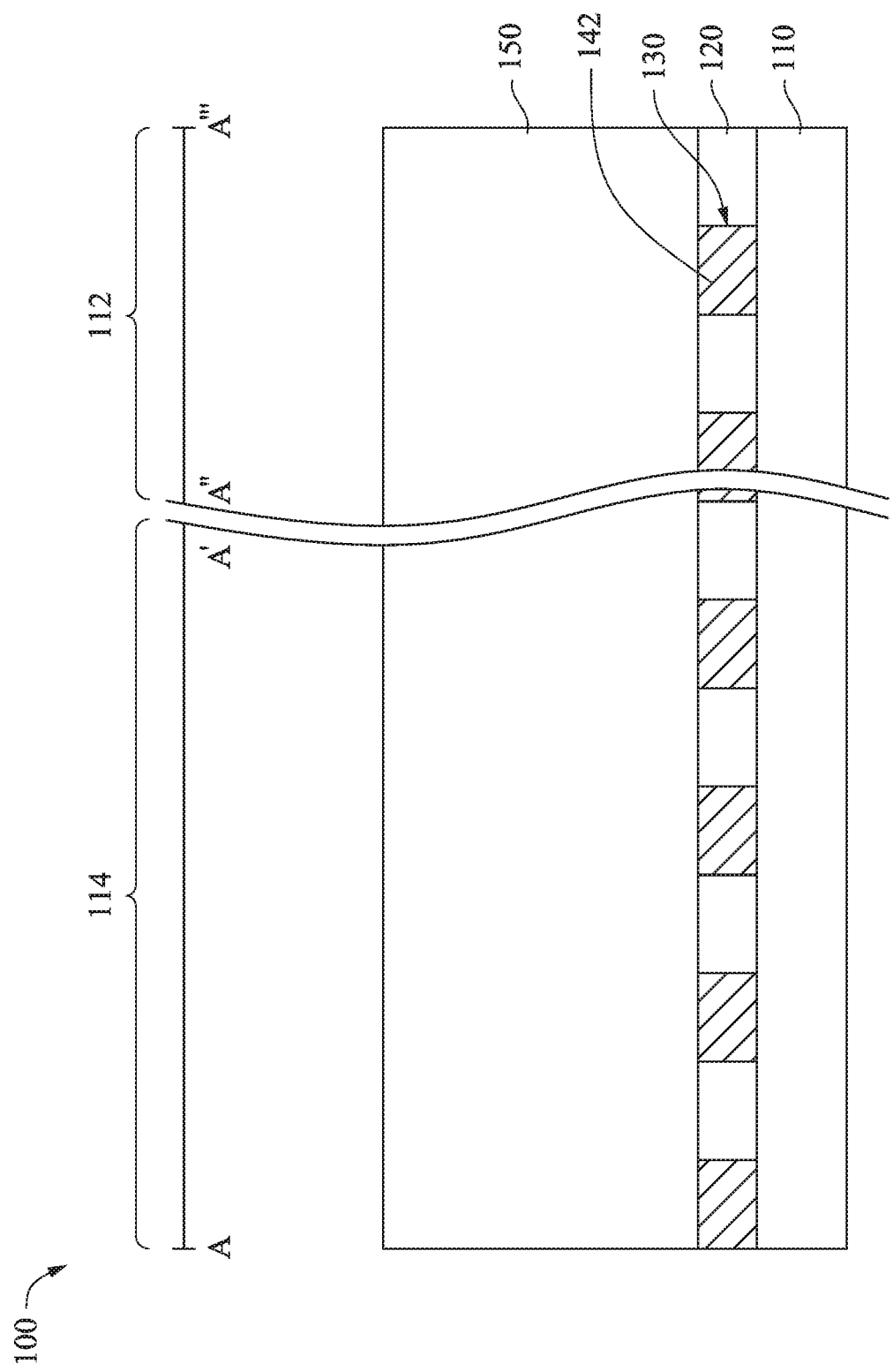

Referring to FIG. 2D, an additional dielectric layer 150 is formed on the semiconductor substrate 110. The dielectric layer 150 may be a single layer or a multi-layered structure. The thickness of the dielectric layer 150 varies with the applied technology, for example a thickness of about 1000 angstroms to about 30000 angstroms. One skilled in the art will realize, however, that the dimensions recited throughout the description are merely examples, and will change if different formation technologies are used.

In some embodiments, the dielectric layer 150 is an oxygen-containing dielectric layer. The dielectric layer 150 may be formed of $SiO_2$, carbon-doped $SiO_2$, a comparatively low dielectric constant (k value) dielectric material with a k value less than about 4.0, or combinations thereof. The dielectric layer 150 may be formed of a low-k dielectric material, an extreme low-k dielectric material, a porous low-k dielectric layer, or combinations thereof. The term "low-k" is intended to define a dielectric constant of a dielectric material of 3.0 or less. The term "extreme low-k (ELK)" means a dielectric constant of 2.5 or less. The term "porous low-k" refers to a dielectric constant of a dielectric material of 2.0 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. The dielectric layer 150 is deposited through any of a variety of techniques, such as CVD, PVD, ALD, RPECVD, LSMCD, coating, spin-coating or another process that is adapted to form a thin film layer over the substrate 110.

Figure 2E:
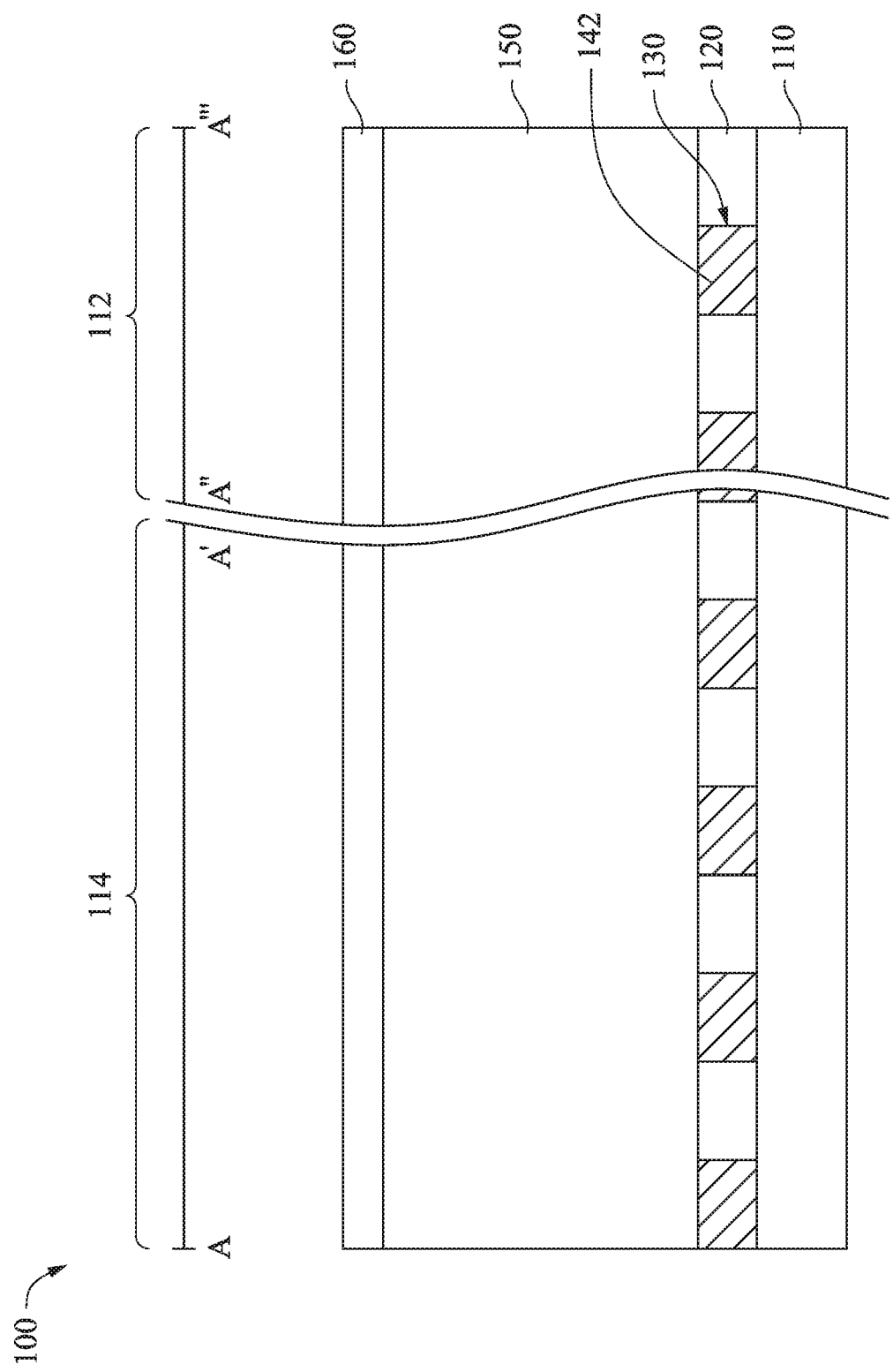

Referring to FIG. 2E, an alignment mark layer 160 is formed on the dielectric layer 150. The alignment mark layer 160 is not conductive. The alignment mark layer 160 can be made of such as silicon carbon or silicon nitride. The alignment mark layer 160 can be formed by a deposition process, such as CVD, PVD, ALD, RPECVD, LSMCD, coating, spin-coating or another process that is adapted to form a thin film layer over the substrate. The thickness of the alignment mark layer 160 is in a range from about 400-1500 angstroms.

Figure 2F:
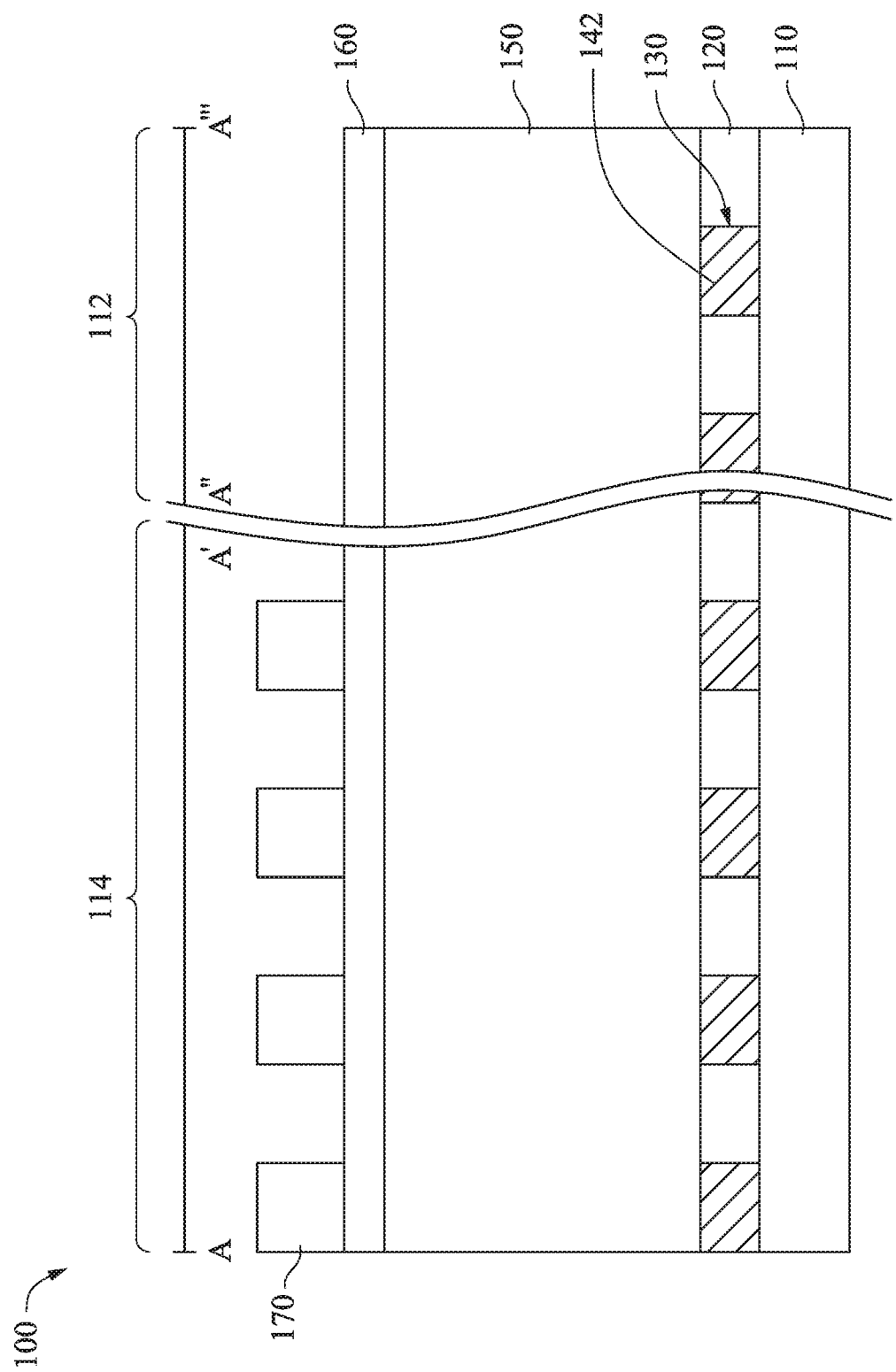

Referring to FIG. 2F, a mask layer 170 is formed on the alignment mark layer 160, and the mask layer 170 is patterned. In some embodiments, the conductive features 142 under the alignment mark layer 160 are utilized as a mark, and the mask for patterning the mask layer 170 may align the mark constructed by the conductive features 142. The mask layer 170 can be a photoresist layer. The mask layer 170 is patterned by a lithography process to form a plurality of features and a plurality of openings defined by the features on the substrate alignment mark layer 160. The pattern of the mask layer 170 is formed according to a predetermined layout. The lithography process may include photoresist coating, exposing, post-exposure baking, and developing.

In some embodiments, the patterned mask layer 170 is disposed only on the alignment mark layer 160 at the alignment region 114 and is not disposed on the alignment mark layer 160 at the product region 112, in which portions of the alignment mark layer 160 at the alignment region 114 are covered by the mask layer 170. In some other embodiments, the patterned mask layer 170 is disposed at both the product region 112 and the alignment region 114, in which portions of the alignment mark layer 160 at the product region 112 and the alignment region 114 are covered by the mask layer 170.

Figure 2G:
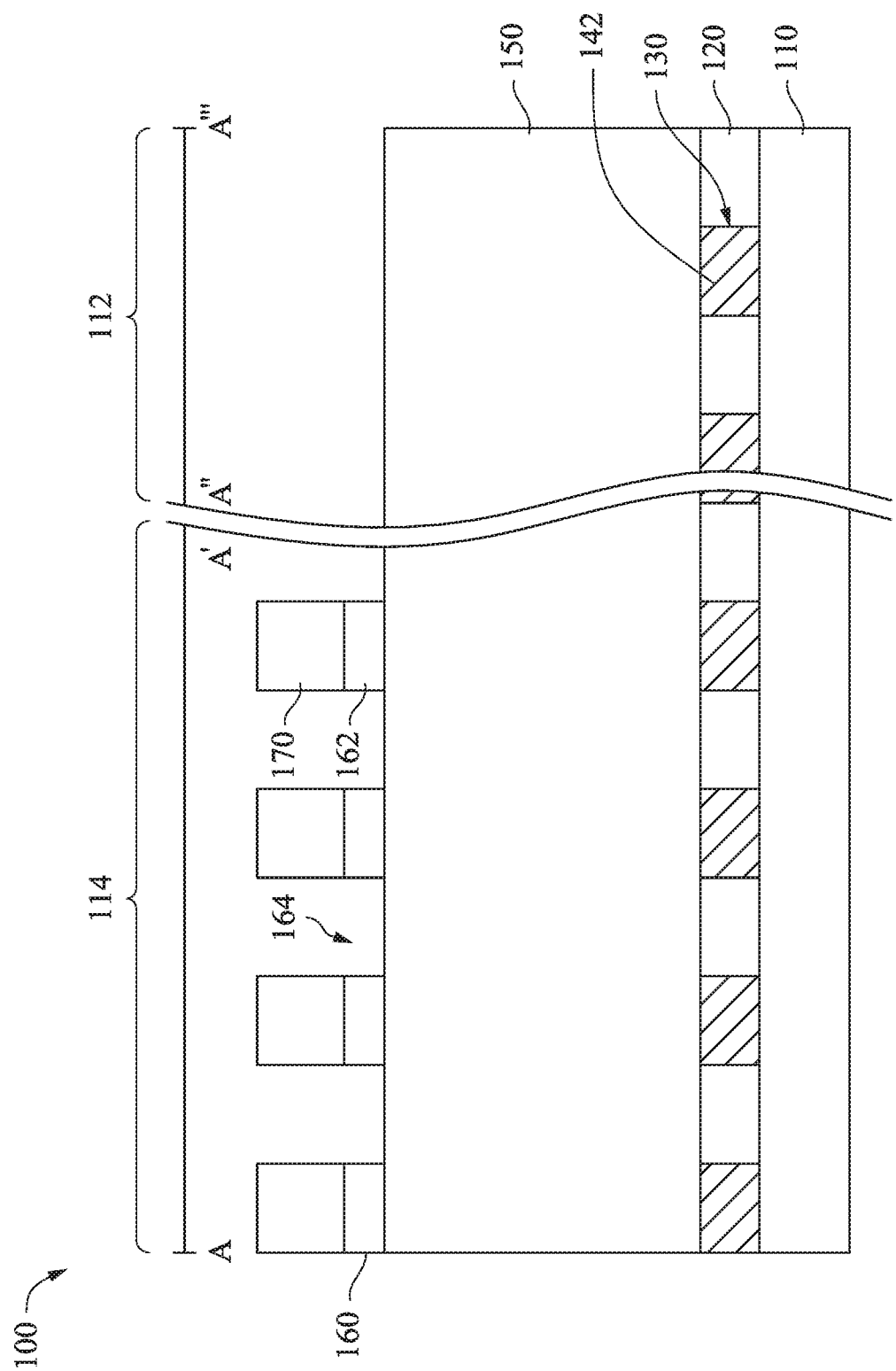

Reference is made to both FIG. 2G. The portions of the alignment mark layer 160 exposed from the mask layer 170 are removed thereby forming a patterned alignment mark layer 160. The portions of the alignment mark layer 160 exposed from the patterned mask layer 170 can be removed by a dry etch process. Various suitable dry etch processes may be used. After the dry etch processing step, the patterned mask layer 170 is removed by, for example, a photolithographic removal process.

In some embodiments, the alignment mark layer 160 at the product region 112 is removed, and the alignment mark layer 160 at the alignment region 114 is patterned. The patterned alignment mark layer 160 forms a plurality of alignment mark features 162 and a plurality of trenches 164 between the alignment mark features 162. The alignment mark features 162 are elongated shaped and are parallel arranged at the alignment region 114. The trenches 164 are defined between the alignment mark features 162, and the trenches 164 are elongated shaped and in a parallel arrangement. The elongated alignment mark features 162 and the elongated trenches 164 are arrangement along x-direction or a y-direction, such that the mark formed by the alignment mark features 162 and the trenches 164 may serve an orientation.

In some embodiments, the trenches 164 penetrate through the alignment mark layer 160, and portions of the underlying dielectric layer 150 are exposed from the trenches 164. Namely, the depth of the trenches 164 is substantially the same as the thickness of the alignment mark layer 160. In some other embodiments, the trenches 164 are arranged in pair, or the distance between the trenches 164 can be varied, such that the orientation served by the trenches 164 can be more recognizable for the following alignment process.

Figure 2H:
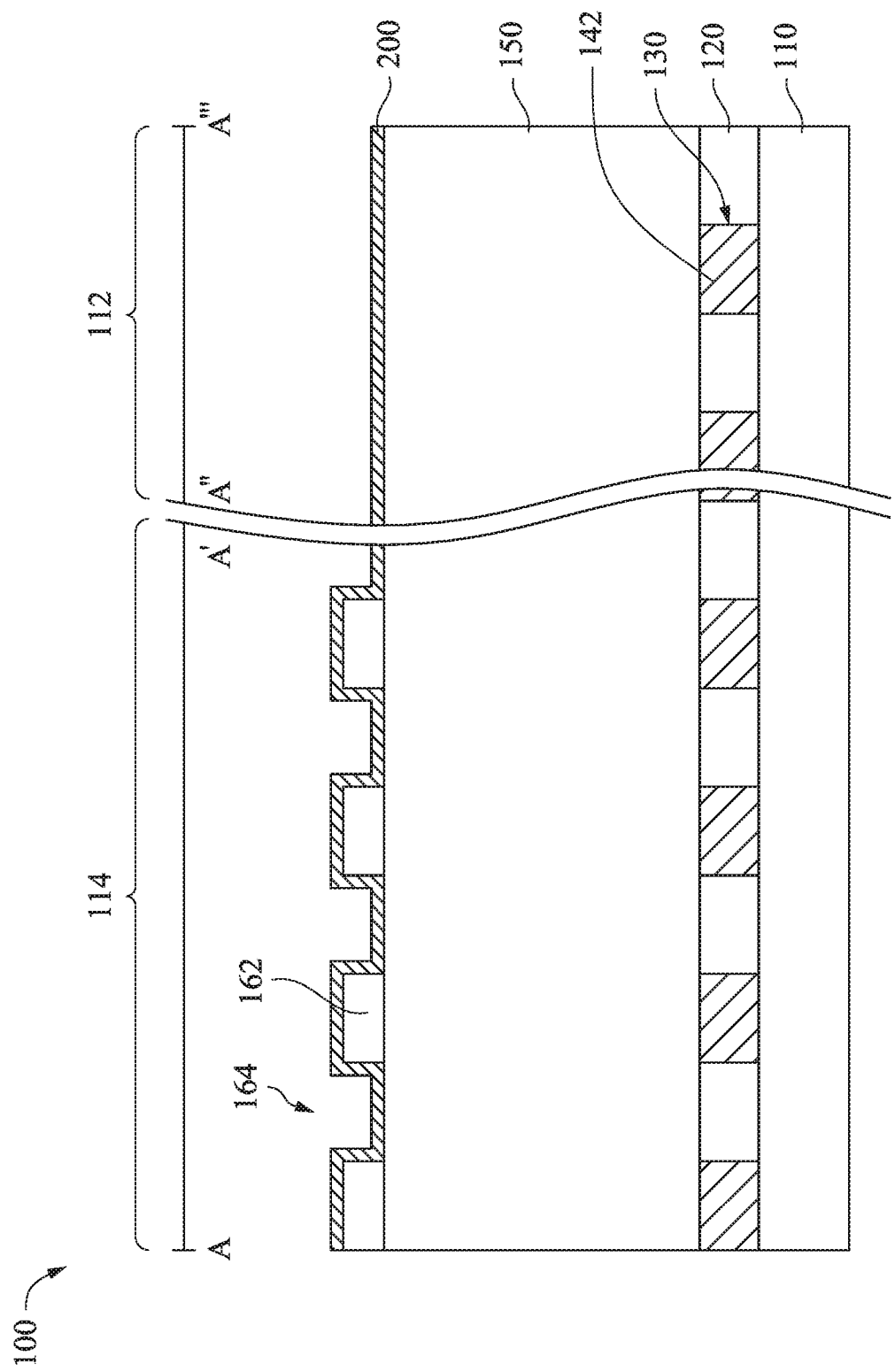

Referring to FIG. 2H, a bottom conductive layer 200 is formed on the semiconductor substrate 110. The bottom conductive layer 200 is formed on the exposed dielectric layer 150 and on the alignment mark layer 160. The bottom conductive layer 200 is formed on the alignment mark features 162 and on the surface of the trenches 164 in a substantially conformal manner. The bottom conductive layer 200 does not fill the trenches 164, thus the trenches 164 remain observable after the bottom conductive layer 200 is formed.

The bottom conductive layer 200 includes a conductive material used to form part of a metal-insulator-metal (MIM) component. The MIM component can be a capacitor. In some embodiments, the bottom conductive layer 200 includes a metallic material. In some embodiments, the metallic material includes aluminum, copper, aluminum copper, tantalum, tantalum nitride, titanium, titanium nitride, tantalum silicon nitride, tungsten, tungsten nitride, other metallic materials, and/or any combinations thereof. The bottom conductive layer 200 can be formed by a deposition process, such as CVD, PVD, ALD, RPECVD, LSMCD, coating, spin-coating or another process that is adapted to form a thin film layer over the substrate. The thickness of the bottom conductive layer 200 is in a range from about 1000-3000 angstroms.

Figure 2I:
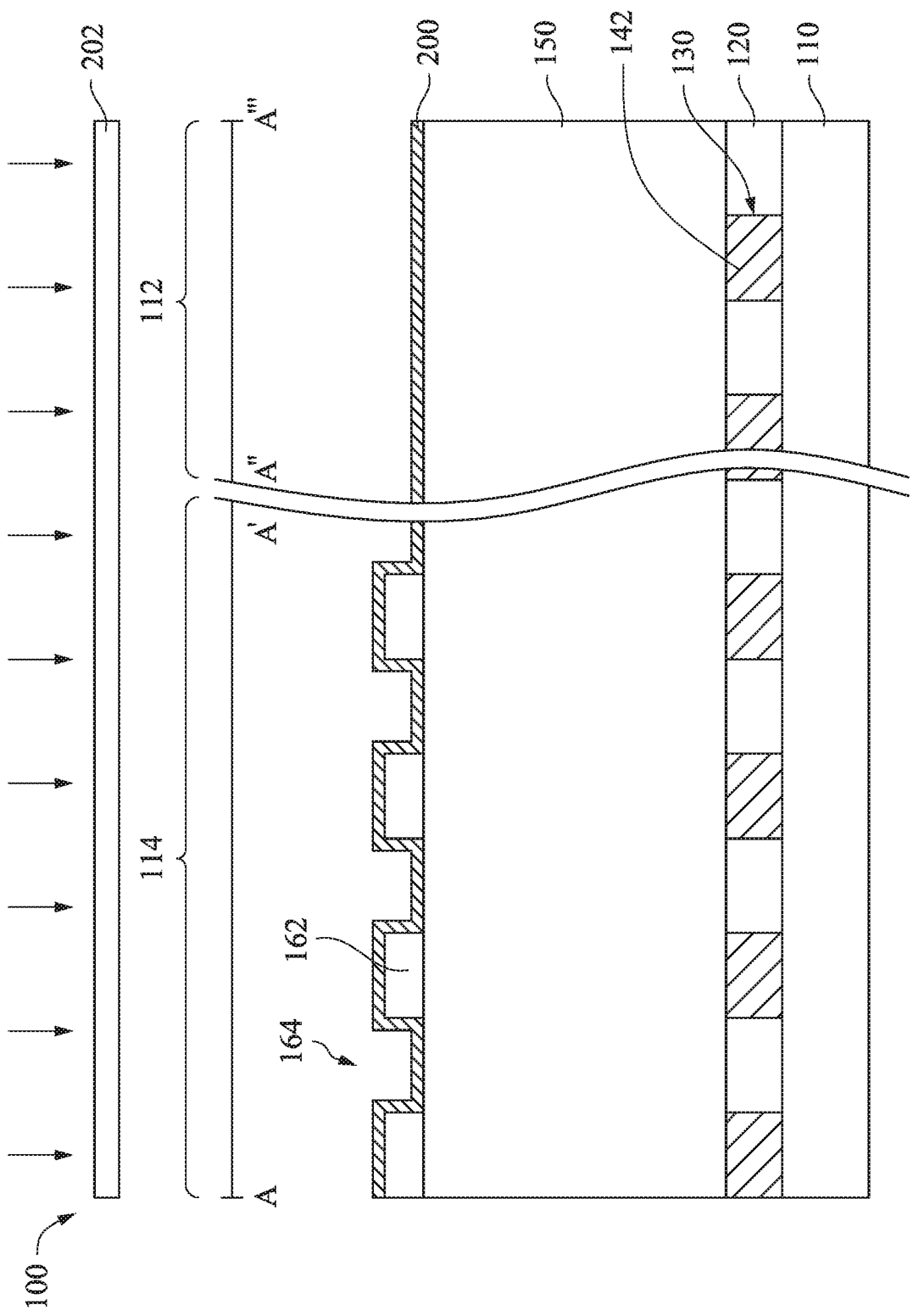

Reference is made to FIG. 2I. In some embodiments, the bottom conductive layer 200 can be optionally patterned to form a bottom electrode of the MIM component. For example, a photoresist layer (not shown) is formed on the bottom conductive layer 200 and is exposed with a pattern to be transferred to the bottom conductive layer 200 by using a mask 202. The mask 202 having the pattern to be transferred to the bottom conductive layer 200 is held and is aligned with the marks (e.g. the trenches 164) at the alignment region 114. The mask 202 is further illuminated with a light beam. The light passing through the mask 202 is then focused on the bottom conductive layer 200. The photoresist layer is exposed and developed and the mask pattern is transferred to the photoresist layer. Using the patterned photoresist as a mask, the pattern is then formed at the bottom conductive layer 200.

Figure 2J:
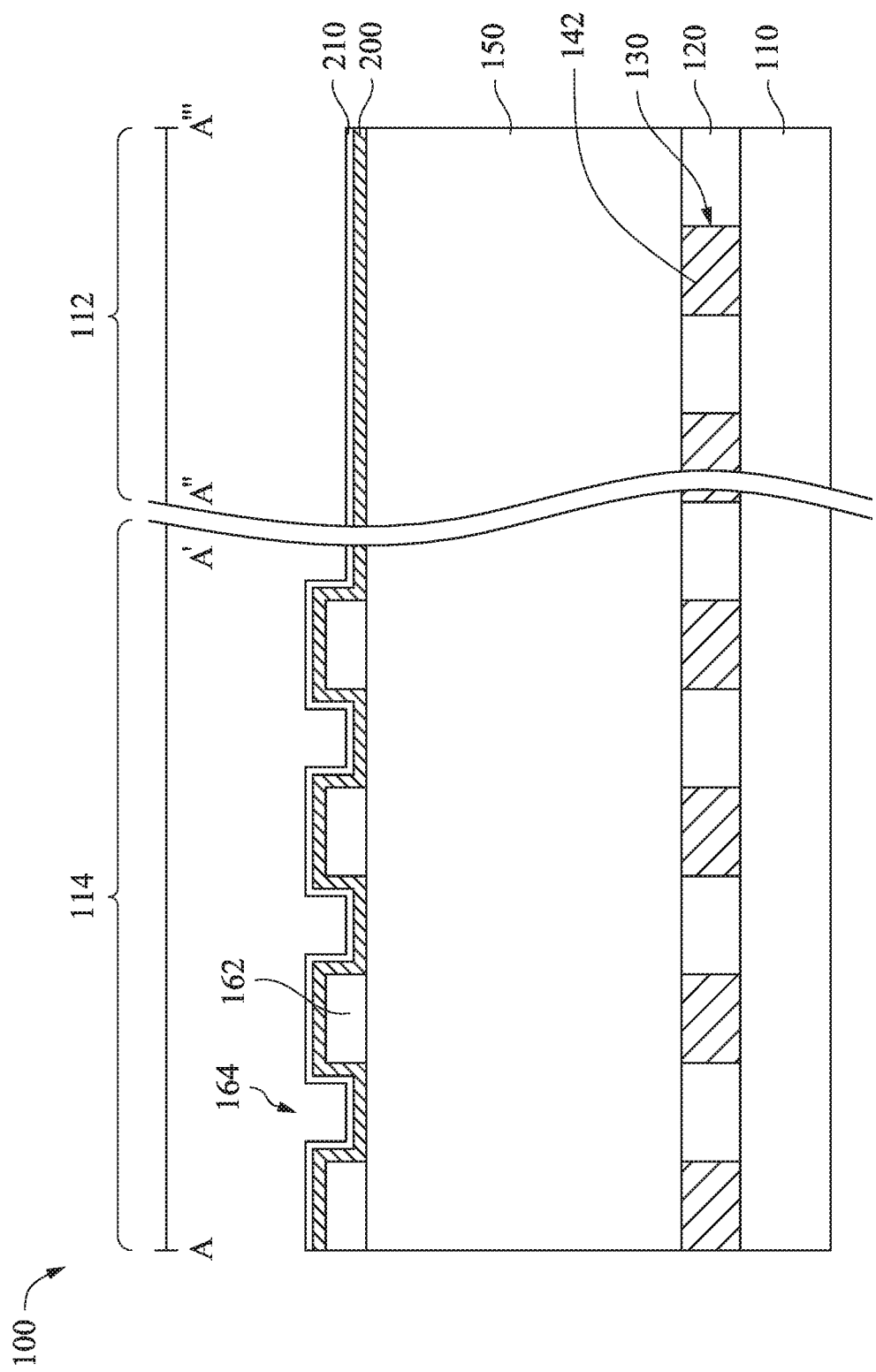

Referring to FIG. 2J, an insulator layer 210 is formed on the bottom conductive layer 200. In some embodiments, the bottom conductive layer 200 can be patterned before the insulator layer 210 is formed on the bottom conductive layer 200. The insulator layer 210 is formed on the bottom conductive layer 200 in a substantially conformal manner. The insulator layer 210 does not fill the trenches 164.

Namely, the trenches 164 are still observable after the insulator layer 210 is formed.

The insulator layer 210 includes an insulator material used to form the MIM component. In some embodiments, the insulator layer 210 has a dielectric constant that is equal to or higher than that of a silicon dioxide, e.g., about 3.9. To increase a capacitance of MIM component, the thickness of insulator layer 210 is reduced and/or a high dielectric constant (high-k) material is used as the insulator layer 210, in some embodiments. For example, the insulator layer 210 includes silicon oxynitride, silicon nitride, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other dielectric materials, and/or any combinations thereof. The insulator layer 210 can be formed by a deposition process, such as CVD, PVD, ALD, RPECVD, LSMCD, coating, spin-coating or another process that is adapted to form a thin film layer over the substrate. The thickness of the insulator layer 210 is in a range from about 100-500 angstroms.

Figure 2K:
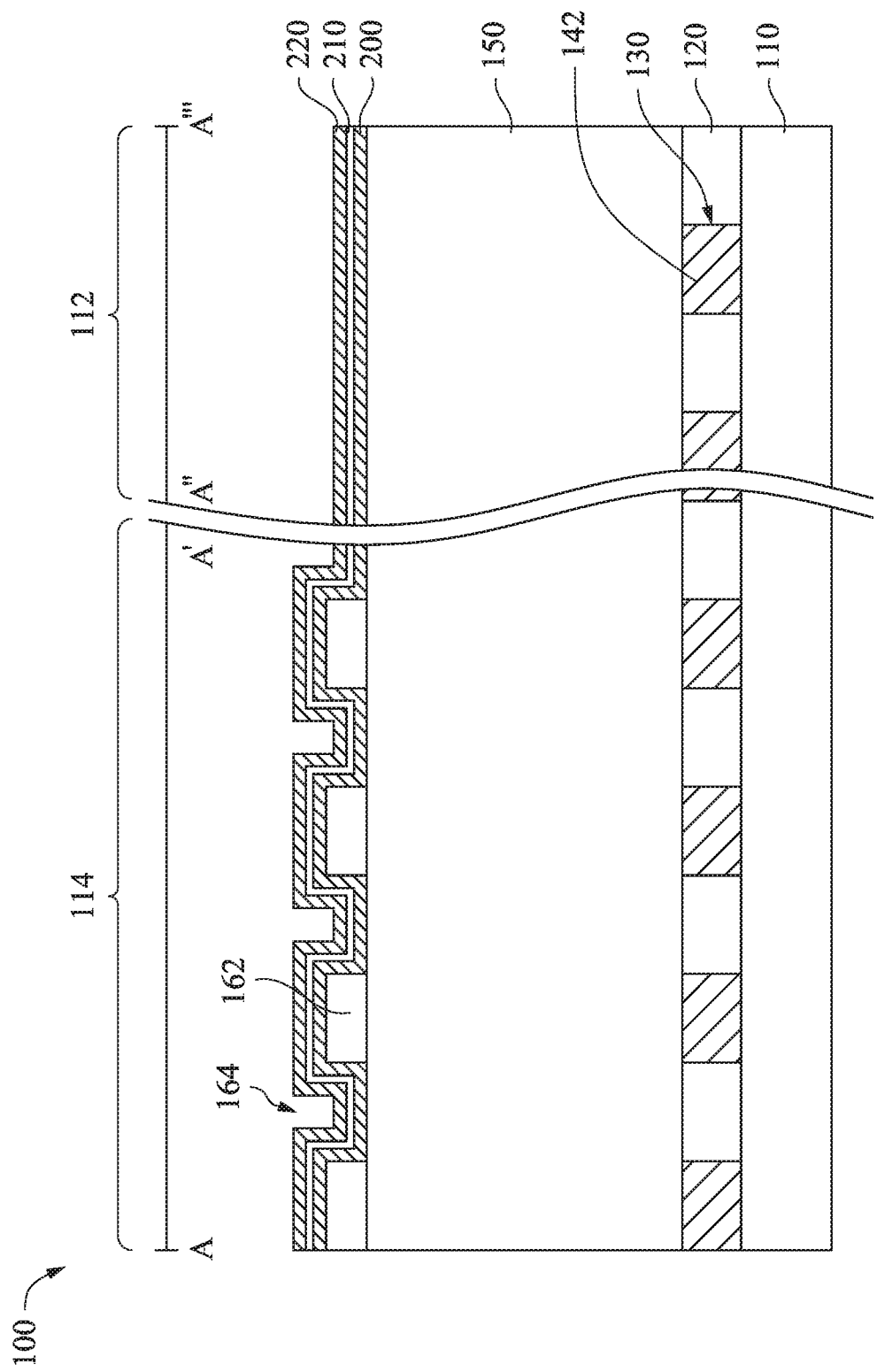

Referring to FIG. 2K, a top conductive layer 220 is formed on the insulator layer 210 in a substantially conformal manner. The top conductive layer 220 is formed on the insulator layer 210 and does not fill the trenches 164. Namely, the trenches 164 still remain observable after the top conductive layer 220 is formed on the insulator layer 210.

The top conductive layer 220 includes a conductive material used to form part of the MIM component. In some embodiments, the top conductive layer 220 includes a metallic material. In some embodiments, the metallic material includes aluminum, copper, aluminum copper, tantalum, tantalum nitride, titanium, titanium nitride, tantalum silicon nitride, tungsten, tungsten nitride, other metallic materials, and/or any combinations thereof. In some embodiments, the top conductive layer 220 includes the same material as the bottom conductive layer 200. In some other embodiments, the top conductive layer 220 includes a material different from the bottom conductive layer 200. The top conductive layer 220 can be formed by a deposition process, such as CVD, PVD, ALD, RPECVD, LSMCD, coating, spin-coating or another process that is adapted to form a thin film layer over the substrate. The thickness of the top conductive layer 220 is in a range from about 500-1500 angstroms.

Figure 2L:
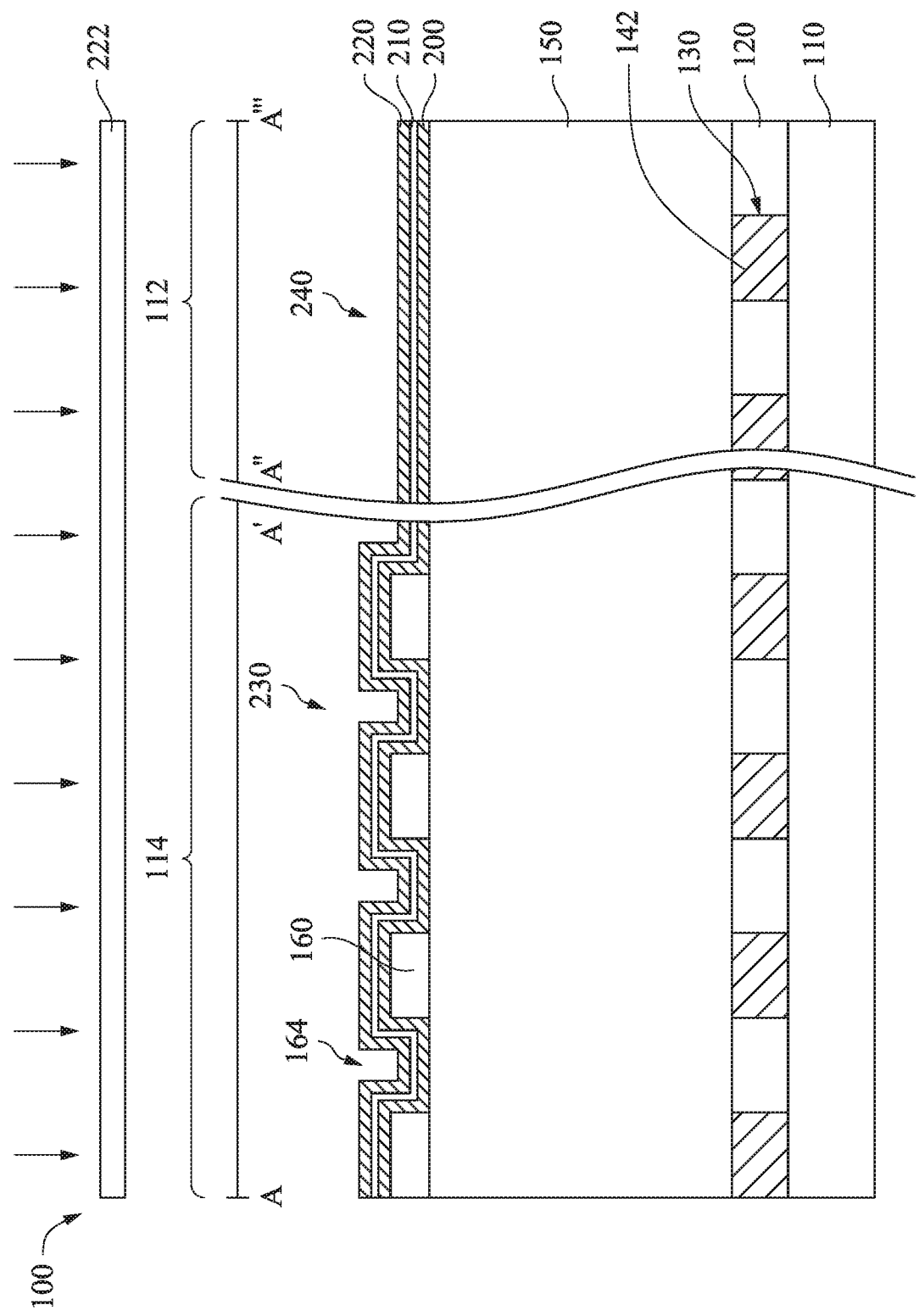

Reference is made to FIG. 2L. In some embodiments, the top conductive layer 220 can be optionally patterned to form a top electrode of the MIM component. For example, a photoresist layer (not shown) is formed on the top conductive layer 220 and is exposed with a pattern to be transferred to the top conductive layer 220 by using a mask 222. The mask 222 having the pattern to be transferred to the top conductive layer 220 is held and is aligned with the marks (e.g. the trenches 164) at the alignment region 114. The mask 222 is further illuminated with a light beam. The light passing through the mask 222 is then focused on the top conductive layer 220. The photoresist layer is exposed and developed and the mask pattern is transferred to the photoresist layer. Using the patterned photoresist as a mask, the pattern is then formed at the top conductive layer 220.

In some embodiments, both the top conductive layer 220 and the bottom conductive layer 200 are patterned to form the MIM component. In some other embodiments, only the top conductive layer 220 or the bottom conductive layer 200 is patterned to form the MIM component.

The first portion of the bottom conductive layer 200, the insulator layer 210, and the top conductive layer 220 form an alignment mark 230 on the alignment region 114, and the second portion of the bottom conductive layer 200, the insulator layer 210, and the top conductive layer 220 form the MIM component 240 on the product region 112. In some embodiments, the dielectric layer 150 is exposed from the trenches 164, and the alignment mark 230 and the MIM component 240 are substantially arrange at the same level. The alignment mark 230 and the MIM component 240 are coplanar arranged on the dielectric layer 150. The trenches 164 are still observable since the alignment mark 230 is formed after the planarization process to the metallization layer. Therefore, the alignment mark 230 including the trenches 164 and the reflective material (e.g. the top conductive layer 220) thereon can server a clear orientation for the following process.

Reference is made to FIG. 3. FIG. 3 is a schematic cross-sectional view of a semiconductor structure, in accordance with some embodiments of the disclosure. FIG. 3 is taken along line A-A'-A"-A'" of FIG. 1, in which the section between A-A' is corresponding to the alignment region 114, and the section between A"-A'" is corresponding to the product region 112.

The semiconductor structure 100 includes the semiconductor substrate 110 having at least one conductive feature 142 thereon. In some embodiments, the conductive features 142 can be a metal line or a via plug. In some embodiments, the alignment region 114 is on the path where a cutting line passes through, and the conductive features 142 are arranged at the product region 112 and are not present at the alignment region 114.

The semiconductor structure 100 includes the dielectric layer 150 disposed on the semiconductor substrate 110 and on the conductive features 142. The semiconductor structure 100 includes the alignment mark layer 160 on the dielectric layer 150. The alignment mark layer 160 is patterned to have a plurality of trenches 164' thereon. However, the trenches 164' do not expose the underlying dielectric layer 150. Namely, the alignment mark layer 160 has thinner thickness at the trenches 164' and has thicker thickness between the trenches 164'.

The semiconductor structure 100 further includes the bottom conductive layer 200, the insulator layer 210, and the top conductive layer 220 disposed on the alignment mark layer 150 in a substantially conformal manner, in which the bottom conductive layer 210 is formed on the alignment mark layer 160, and the insulator layer 220 is sandwiched between the bottom conductive layer 210 and the top conductive layer 220. The trenches 164' are not filled by the bottom conductive layer 200, the insulator layer 210, and the top conductive layer 220. The trenches 164' remain observable after the bottom conductive layer 200, the insulator layer 210, and the top conductive layer 220 are formed.

The first portion of the bottom conductive layer 200, the insulator layer 210, and the top conductive layer 220 form the alignment mark 230 on the alignment region 114, and the second portion of the bottom conductive layer 200, the insulator layer 210, and the top conductive layer 220 form the MIM component 240 on the product region 112. The trenches 164' are still observable since the alignment mark 230 is formed after the planarization process to the metallization layer. Therefore, the alignment mark 230 including the trenches 164' and the reflective material (e.g. the top conductive layer 220) thereon can server a clear orientation for the following process.

According to some embodiments of the disclosure, a semiconductor structure includes a substrate having at least one product region and at least one alignment region disposed adjacent to the product region. The semiconductor structure includes an alignment mark layer disposed at least on the alignment region, in which the alignment mark layer has at least one alignment mark feature therein. The semiconductor structure further includes a bottom conductive layer at least partially disposed on the alignment mark feature in a substantially conformal manner, an insulator layer disposed on the bottom conductive layer, and a top conductive layer disposed on the insulator layer.

According to some embodiments of the disclosure, a method of fabricating a semiconductor structure includes forming an alignment mark layer on a substrate; patterning the alignment mark layer for forming at least one alignment mark feature; forming a bottom conductive layer on the patterned alignment mark layer in a substantially conformal manner; forming an insulator layer on the bottom conductive layer; and forming a top conductive layer on the insulator layer.

According to some embodiments of the disclosure, a method of fabricating a semiconductor structure includes forming at least one conductive feature in a first dielectric layer; forming a second dielectric layer on the first dielectric layer; forming at least one alignment mark feature on the second dielectric layer; forming a bottom conductive layer at least on the alignment mark feature in a substantially conformal manner; forming an insulator layer on the bottom conductive layer; and forming a top conductive layer on the insulator layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure comprising:
  a substrate comprising:
    a first product region; and
    an alignment region disposed adjacent the first product region;
  a first dielectric layer disposed over the substrate;
  a first alignment mark feature and a second alignment mark feature disposed over the alignment region, wherein:
    a first portion of the first dielectric layer underlies the first alignment mark feature,
    a second portion of the first dielectric layer underlies the second alignment mark feature, and
    the first dielectric layer extends continuously between the first portion and the second portion;
  a bottom conductive layer disposed over the first alignment mark feature and the second alignment mark feature in a substantially conformal manner;
  an insulator layer disposed over the bottom conductive layer; and
  a top conductive layer disposed over the insulator layer.
2. The semiconductor structure of claim 1, wherein the bottom conductive layer, the insulator layer, and the top conductive layer are further disposed over the first product region to form a metal-insulator-metal (MIM) component over the first product region.
3. The semiconductor structure of claim 1, comprising:
  a conductive feature disposed under the first dielectric layer, wherein the first alignment mark feature overlies the conductive feature.
4. The semiconductor structure of claim 1, wherein the first alignment mark feature and the bottom conductive layer are in contact with the first dielectric layer.
5. The semiconductor structure of claim 1, wherein:
  the first alignment mark feature protrudes from an alignment mark layer, and
  the bottom conductive layer is spaced apart from the first dielectric layer by the alignment mark layer.
6. The semiconductor structure of claim 5, wherein the first dielectric layer and the alignment mark layer are further disposed over the first product region.
7. The semiconductor structure of claim 1, wherein the bottom conductive layer is in contact with a sidewall and a top surface of the first alignment mark feature.
8. The semiconductor structure of claim 1, comprising:
  a second dielectric layer disposed under the first dielectric layer; and
  a conductive feature disposed over the first product region and extending through the second dielectric layer, wherein:
    the first dielectric layer is disposed over the conductive feature, and
    the bottom conductive layer is spaced apart from the conductive feature by the first dielectric layer.
9. The semiconductor structure of claim 8, wherein the first dielectric layer and the second dielectric layer are disposed over the first product region and the alignment region.
10. The semiconductor structure of claim 1, wherein:
  the substrate comprises a second product region, and
  the alignment region is disposed between first product region and the second product region.
11. The semiconductor structure of claim 1, wherein the first alignment mark feature comprises silicon carbon or silicon nitride.
12. A semiconductor structure comprising:
  a conductive feature;
  a dielectric layer overlying the conductive feature such that a line perpendicular to and intersecting a top surface of the conductive feature also intersects the dielectric layer;
  a first alignment mark feature disposed over the dielectric layer;
  a bottom conductive layer in contact with a top surface and a sidewall of the first alignment mark feature;
  an insulator layer disposed over the bottom conductive layer; and
  a top conductive layer disposed over the insulator layer.
13. The semiconductor structure of claim 12, wherein the first alignment mark feature and the bottom conductive layer are in contact with the dielectric layer.
14. The semiconductor structure of claim 12, wherein:
  the first alignment mark feature protrudes from an alignment mark layer, and
  the bottom conductive layer is spaced apart from the dielectric layer by the alignment mark layer.
15. The semiconductor structure of claim 12, comprising:
  a second alignment mark feature disposed over the dielectric layer, wherein:

a first portion of the dielectric layer underlies the first alignment mark feature, a second portion of the dielectric layer underlies the second alignment mark feature, and the dielectric layer extends continuously between the first portion and the second portion.

16. The semiconductor structure of claim 12, wherein the bottom conductive layer is spaced apart from the dielectric layer.

17. A semiconductor structure comprising:

a substrate comprising:

a product region; and an alignment region disposed adjacent the product region;

an alignment mark layer disposed over the alignment region and comprising:

a first portion extending from a bottommost surface of the alignment mark layer to a topmost surface of the alignment mark layer at a first location; and a second portion extending from the bottommost surface of the alignment mark layer to the topmost surface of the alignment mark layer at a second location, wherein the first portion of the alignment mark layer has a first height and the second portion of the alignment mark layer has a second height different than the first height; and a bottom conductive layer disposed over the first portion of the alignment mark layer and the second portion of the alignment mark layer.

18. The semiconductor structure of claim 17, comprising:

a dielectric layer disposed under the alignment mark layer, wherein the bottom conductive layer is spaced apart from the dielectric layer by the first portion of the alignment mark layer and the second portion of the alignment mark layer.

19. The semiconductor structure of claim 17, comprising:

a first dielectric layer;

a conductive feature disposed over the product region and extending through the first dielectric layer; and a second dielectric layer disposed over the conductive feature, wherein the first portion of the alignment mark layer is spaced apart from the conductive feature by the second dielectric layer.

20. The semiconductor structure of claim 17, comprising:

a dielectric layer between the substrate and the alignment mark layer, wherein:

the first portion of the alignment mark layer defines a first alignment mark feature, a third portion of the alignment mark layer defines a second alignment mark feature, the second portion of the alignment mark layer is between the first portion of the alignment mark layer and the third portion of the alignment mark layer, a first portion of the dielectric layer underlies the first alignment mark feature, a second portion of the dielectric layer underlies the second alignment mark feature, and the dielectric layer extends continuously between the first portion of the dielectric layer and the second portion of the dielectric layer.

\* \* \* \* \*